United States Patent [19]
Demmler et al.

[11] Patent Number: 5,685,361
[45] Date of Patent: Nov. 11, 1997

[54] MOTOR VEHICLE WITH A HEAT EXCHANGER HOUSING SYSTEM FOR COOLING AUTOMOTIVE ACCESSORY COMPONENTS AND A HEAT EXCHANGER HOUSING SYSTEM FOR COOLING AUTOMOTIVE ACCESSORY COMPONENTS IN A MOTOR VEHICLE

[75] Inventors: Holger Demmler, Wonfurt; Adolf Karl, Schweinfurt, both of Germany

[73] Assignee: Fichtel & Sachs AG, Schweinfurt, Germany

[21] Appl. No.: 439,467

[22] Filed: May 11, 1995

[30] Foreign Application Priority Data

May 11, 1994 [DE] Germany .................. 44 16 616.8

[51] Int. Cl.[6] .................. H05K 7/20; F28D 21/00
[52] U.S. Cl. .................. 165/41; 165/80.4; 165/80.5; 165/146; 123/198 E; 123/41.31; 361/699; 361/707
[58] Field of Search .................. 123/41.31, 198 E; 165/80.4, 80.5, 146; 361/699, 707

[56] References Cited

U.S. PATENT DOCUMENTS

| | | | |
|---|---|---|---|
| 3,817,321 | 6/1974 | Von Cube et al. | 165/80.4 |
| 4,559,995 | 12/1985 | Van der Stuyf | 123/198 E |
| 4,712,158 | 12/1987 | Kikuchi et al. | 361/385 |
| 4,763,611 | 8/1988 | Kobayashi et al. | 123/41.31 |
| 4,765,397 | 8/1988 | Chrysler et al. | 165/146 |
| 4,863,590 | 9/1989 | Kashimura et al. | 123/41.31 |
| 4,899,256 | 2/1990 | Sway-Tin | 361/386 |
| 5,005,640 | 4/1991 | Lapinski et al. | 165/80.4 |
| 5,088,005 | 2/1992 | Ciaccio | 361/385 |
| 5,239,200 | 8/1993 | Messina et al. | 165/80.4 |
| 5,251,100 | 10/1993 | Fujita et al. | 165/80.4 |
| 5,349,498 | 9/1994 | Tanzer et al. | 165/80.4 |

FOREIGN PATENT DOCUMENTS

| | | |
|---|---|---|
| 1639047 | 1/1971 | Germany . |
| 3040776 | 5/1982 | Germany . |
| 3605554 | 8/1987 | Germany . |
| 4217289 | 12/1993 | Germany . |
| 0087822 | 3/1989 | Japan .................. 123/41.31 |

*Primary Examiner*—John K. Ford
*Attorney, Agent, or Firm*—Nils H. Ljungman and Associates

[57] ABSTRACT

A motor vehicle housing, for cooling automotive type accessory components, with a receptacle chamber designed for the installation of pre-determined components, and with a cooling chamber sealed with respect to the receptacle chamber and adjacent to it, which cooling chamber is connected with an inlet for coolant and with an outlet for the coolant, has been improved so that no coolant can get into the receptacle chamber, and the receptacle chamber has zones in which different degrees of cooling can take place. For this purpose the cooling chamber is provided with an integrated flow guide for the coolant which, in a first segment adjacent to the inlet, has an expanded portion which provides for a distribution of the coolant over a large surface, and in a second segment runs so that, in relation to a predetermined total length of the flow guide, the heat exchange surface of the flow guide assumes a maximum opposite the contact surface in this segment between the cooling chamber and the receptacle chamber.

15 Claims, 6 Drawing Sheets

5,685,361

MOTOR VEHICLE WITH A HEAT EXCHANGER HOUSING SYSTEM FOR COOLING AUTOMOTIVE ACCESSORY COMPONENTS AND A HEAT EXCHANGER HOUSING SYSTEM FOR COOLING AUTOMOTIVE ACCESSORY COMPONENTS IN A MOTOR VEHICLE

BACKGROUND OF THE INVENTION

1. Field of the Invention

This invention relates to a housing in a motor vehicle for cooling automotive accessory components, and more specifically to a housing with a receptacle chamber designed for the installation of pre-determined components, and with a cooling chamber sealed with respect to the receptacle chamber and adjacent to it, which cooling chamber is connected to an inlet or feed for coolant and to an outlet or discharge for the coolant.

2. Background Information

German Patent No. 42 17 289 A1 discloses a housing which is designed for the installation of pre-determined components in a receptacle chamber. The receptacle chamber is separated by means of a contact plate from a cooling chamber which carries a flow of coolant and is sealed with respect to the receptacle chamber by means of rails, preferably designed so that they are elastic.

With such a housing, with increasing aging of the sealing strips, there is a risk that coolant will get into the receptacle chamber, where it can damage or even destroy the components installed there. Moreover, since no special precautions have been taken with regard to the flow path, it can be assumed that the cooling action produced by the coolant will be approximately equal along its flow path through the cooling chamber, so that inside the housing, no major temperature differences can be expected. Such a housing is consequently suitable for use only if all the installed components have approximately the same requirements regarding the internal temperature of the chamber.

OBJECT OF THE INVENTION

The object of the invention is to design a housing with a receptacle chamber which is designed for the installation of predetermined components so that the receptacle chamber is absolutely sealed with regard to the unintentional penetration of coolant, and can be cooled so that it can have zones where the cooling action is performed in different degrees.

SUMMARY OF THE INVENTION

The invention teaches that this object can be accomplished by means of the housing with a receptacle chamber designed for the installation of pre-determined components, and with a cooling chamber sealed with respect to the receptacle chamber and adjacent to it, which cooling chamber is connected to an inlet or feed for coolant and to an outlet or discharge for the coolant.

As a result of the integration of the flow guide into the cooling chamber, the cooling chamber, in itself, is absolutely sealed from the outside, so that an additional sealing apparatus between the cooling chamber and the receptacle chamber is unnecessary. In this manner, it can be guaranteed that no coolant which flows through the flow guide can escape from it an travel through the cooling chamber into the receptacle chamber.

One particular advantage of the flow guide is that both the path of the coolant inside the cooling chamber and other factors which promote a good cooling action are guaranteed inside the cooling chamber. For example, after it has travelled through the inlet into a first segment of the flow guide, where it flows with a large temperature difference to the components located in this area and is distributed over a large area, and thus has the opportunity on its path through this first segment to extract as much heat as possible from the components. On account of the distribution of the coolant over a large area, the flow guide in this segment can be kept very flat, which means that almost the entire height of the housing is available to hold components. After passing through the preferably first segment, the coolant has already been heated significantly, so that its ability to absorb heat is no longer as high as it was immediately downstream of the inlet. Nevertheless, to also guarantee a good cooling action in the second segment of the flow guide, in this segment, on account of a special configuration of the flow guide, the heat exchange surface is as large as possible with respect to the contact surface between the cooling chamber and the receptacle chamber, so that in spite of the lower temperature difference in this segment, there is an excellent heat exchange between the components and the coolant. It is therefore appropriate to place components which require a particularly strong cooling in the first segment of the flow guide, while components which produce a significant amount of heat during their operation, which heat must be extracted and discharged outward in the vicinity of the second segment of the cooling chamber, should be located in the vicinity of the second segment.

When the coolant has also flowed through the last-named segment, it is transported via the discharge out of the housing, and to a cooler if necessary.

A segment which provides for a distribution of the coolant over a large surface is adjacent to the inlet and the other segment empties into the outlet is an advantageous embodiment of the flow guide. The flow guide (4) in the first segment (7) is formed by a broad trough (8) of low height. The flow guide in the first segment is designed so that it requires only a low height for itself, and the coolant can act on the components to be cooled over the widest possible active surface. As a result of the fact that the trough (8) has the smallest possible number of flow deflectors, there is a predominantly laminar flow in this segment. In contrast, the flow guide in which the second segment (9) is formed by at least one channel (10, 11) which leads by means of a number of flow deflectors to the discharge (15), the second segment is designed so that the formation of turbulence is promoted by a number of flow deflectors, which means that the heat exchange can be increased.

During the heating of the coolant, air bubbles can escape from it, which experience tells us will escape upward. These air bubbles can be transported particularly well through the coolant, if the flow guide inside the second segment can be guided from a relatively lower level to a higher level. The air bubbles then escape toward the higher level ahead of the advancing coolant.

This process continues until it reaches the highest level of the flow guide at the discharge, the highest level of the flow guide being when it reaches the outlet, at which point the air bubbles can be discharged from the housing by means of a separate outlet (not shown).

As a result of the use of the separation plate, a uniformly high heat exchange is guaranteed inside the corresponding segment of the housing, since temperature differences are equalized.

BRIEF DESCRIPTION OF THE DRAWINGS

One embodiment of the invention is explained in greater detail below and is illustrated in the accompanying drawings.

DESCRIPTION OF THE PREFERRED EMBODIMENT

Figure 1:
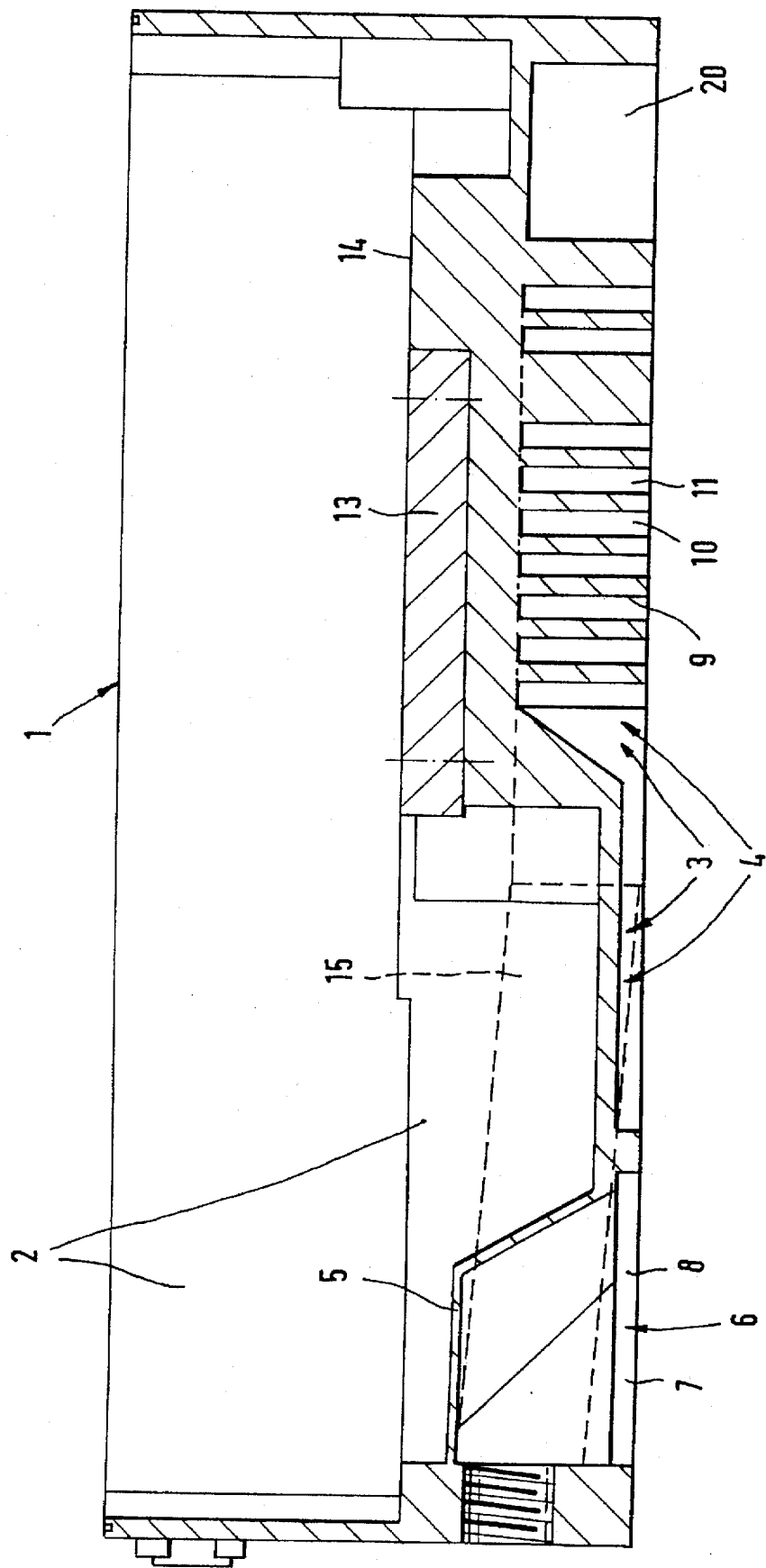
FIG. 1 shows a side view of a housing designed to hold components with a receptacle chamber and, below it, a cooling chamber.
Figure 2:
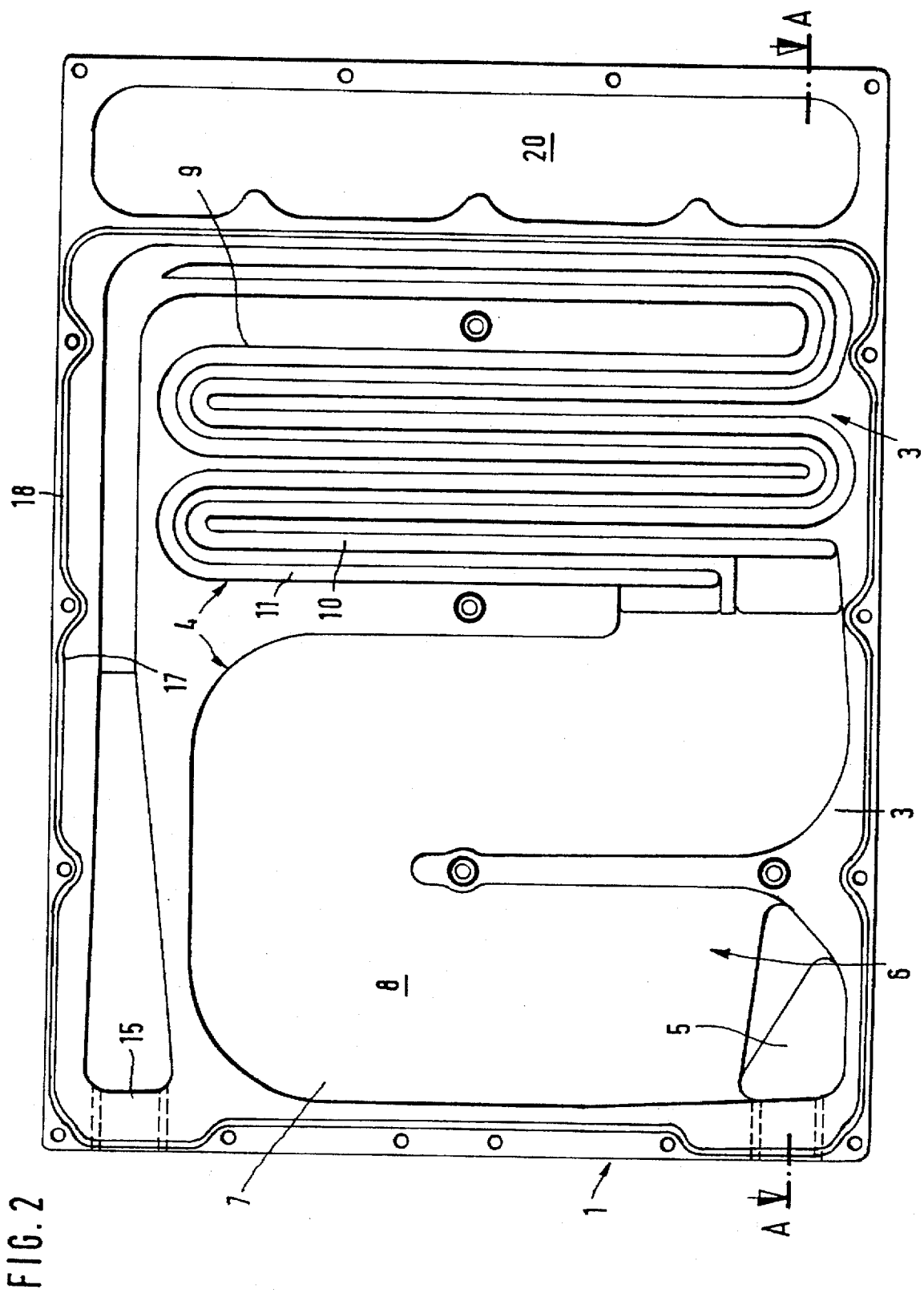
FIG. 2 shows the cooling chamber from the underside of the housing.

FIGS. 1 and 2 each show a housing 1 which has a receptacle chamber 2 (FIG. 1) for components (not shown), preferably for electronic components, and a cooling chamber 3 underneath it. This cooling chamber 3, as shown in particular in FIG. 2, has a flow guide 4 for the coolant which travels through an inlet 5 into the housing 1. This inlet 5 is preferably provided in the lower portion of the housing 1, and empties into a first segment 7 of the flow guide 4, in which the flow guide runs in the form of an expanded portion 6 in the form of a flat but broad trough 8 with a single deflection by 180 degrees, before, in a second segment 9 of the flow guide 4, it branches into two different channels 10, 11. These channels are designed so that they are smaller by several times than the trough 6 of the flow guide in the first segment, and run so that as they are guided into and out of one another, they encounter a number of deflectors. On account of the interlocking arrangement of the channels 10, 11, the channels run close against and underneath a separation plate 13 which is designed to hold components, so that over the entire contact surface 14 holding the separating plate 13, an almost continuous cooling action and thus a relatively large heat exchange become possible. The two channels 10, 11, after passing through the second segment 9 of the flow guide 4, empty into a common outlet 15, from which they may be continued, if necessary, to a cooler (not shown).

The flow guide 4 of the housing 1 functions as follows:

When fresh coolant is introduced through the input 5 into the housing 1, this coolant flows through the trough 8 and thereby, on account of its large temperature difference from the components located above the trough, absorbs a great deal of heat from those components. It is therefore appropriate to locate components which require a strong cooling in this area of the receptacle chamber 2. On account of the flat design of the trough 8, these components may occupy nearly the entire height of the housing 1. Functioning in this manner, the coolant, when it reaches the transition to the second segment of the flow guide 4, has already been heated to some extent, so that its temperature difference from the components which are located above the contact surface 14 toward the receptacle chamber 2, is significantly less than it was in the first segment. As a result of the interlocking arrangement of the channels 10, 11, there is nevertheless a large heat exchange surface available, so that components which generate a relatively large amount of heat which must be extracted but which ultimately do not require excessively low operating temperatures should be located above these channels 10, 11. In particular in the second segment 9 of the flow guide 4, in which the coolant is already heated, air bubbles can be formed which are pushed along ahead of the advancing coolant. To reduce this problem, the channels 10, 11 inside the second segment 9 can be located so that, beginning from the transition of the first segment 7 to the second segment, until reaching the outlet 15, they ascend continuously, so that air bubbles which are formed can be pushed along particularly efficiently by the advancing coolant. In the vicinity of the outlet 15, the air bubbles can be transported out of the housing 1 in a manner not shown.

As illustrated in FIG. 2, the housing 1 is provided along the circumference with a groove 17 to hole a seal 18, preferably a toroidal sealing ring, so that the receptacle chamber 2 is sealed in a pressure-tight matter with respect to the environment of the housing 1. In addition, to provide for a dust-free evacuation, the receptacle chamber is connected by means of a connection (not shown) to an equalization chamber 20 which is designed so that it is dust-tight but not pressure-tight. The equalization chamber 20 absorbs the pressure fluctuations which occur in the receptacle chamber 2 and slowly dissipates them with respect to the environment of the housing.

Figure 3:
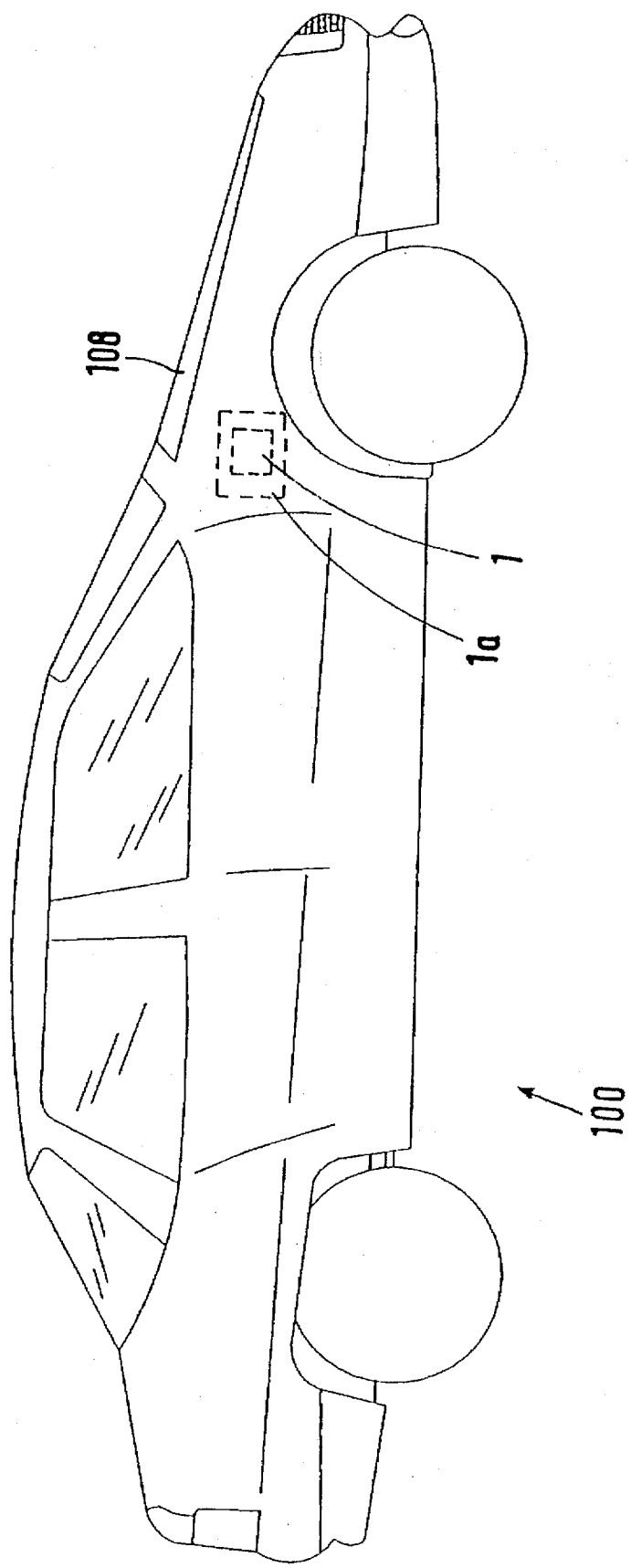
FIG. 3 is a side elevational view of an automobile which may incorporate the device of the present invention.

FIG. 3 shows an automobile 100 which includes a hood 108. Illustrated in this Figure is a heat exchanger housing system 1a, in which the housing 1 is contained.

Figure 3A:
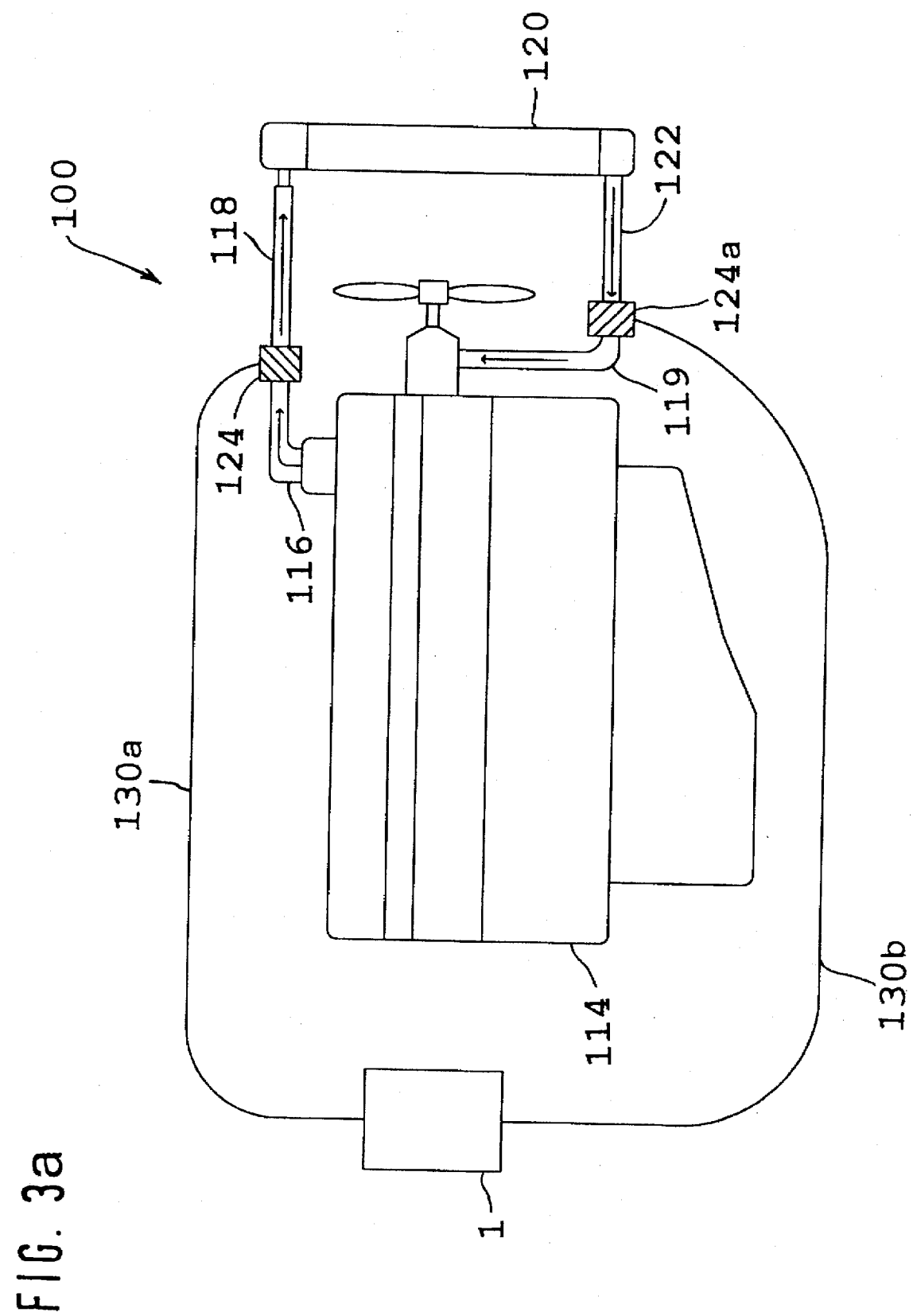
FIG. 3a shows an internal combustion engine which may utilize the present invention.

FIG. 3a shows, schematically, a possible layout of internal combustion engine 114 within automobile 100, as well as a portion of an engine coolant circuit. A radiator inlet hose, divided into two segments 116 and 118, a radiator 120 and a radiator outlet hose 122 constitute at least part of the engine coolant circuit. The radiator inlet hose, whose segments 116 and 118 may consist of a flexible material, such as rubber, is shown to route coolant from engine 114 to radiator 120, while the radiator outlet hose 122 is shown to route coolant from radiator 120 to engine 114. A connection device 124 connects hose segments 116 and 118. Also illustrated is a hose section 130a, stemming from connection device 124. Through hose section 130a, fluid may be passed into housing 1. The fluid can then continue through hose section 130b, and be released into the radiator outlet hose 122 through connection device 124a. Connection device 124a is a device similar to connection device 124. It should also be understood that this flow of fluid can be reversed, and the fluid can originate through connection device 124a and into hose section 130b, then through the housing 1, into hose section 130a, and through connection device 124, the fluid will then be released into radiator inlet hose 118. It should be understood that the layout shown in FIG. 3a is primarily schematic in nature, and furthermore presents just one possible example of a layout of the present invention. The connection device 124 may also be a diameter reduction device, "T" connection, bleed fitting, or other interconnection device, junction device, or tap fitting already required by the installation of the cooling circuit. Furthermore, the location of the connection device 124 is not limited to that shown in FIG. 3a.

Figure 1A:
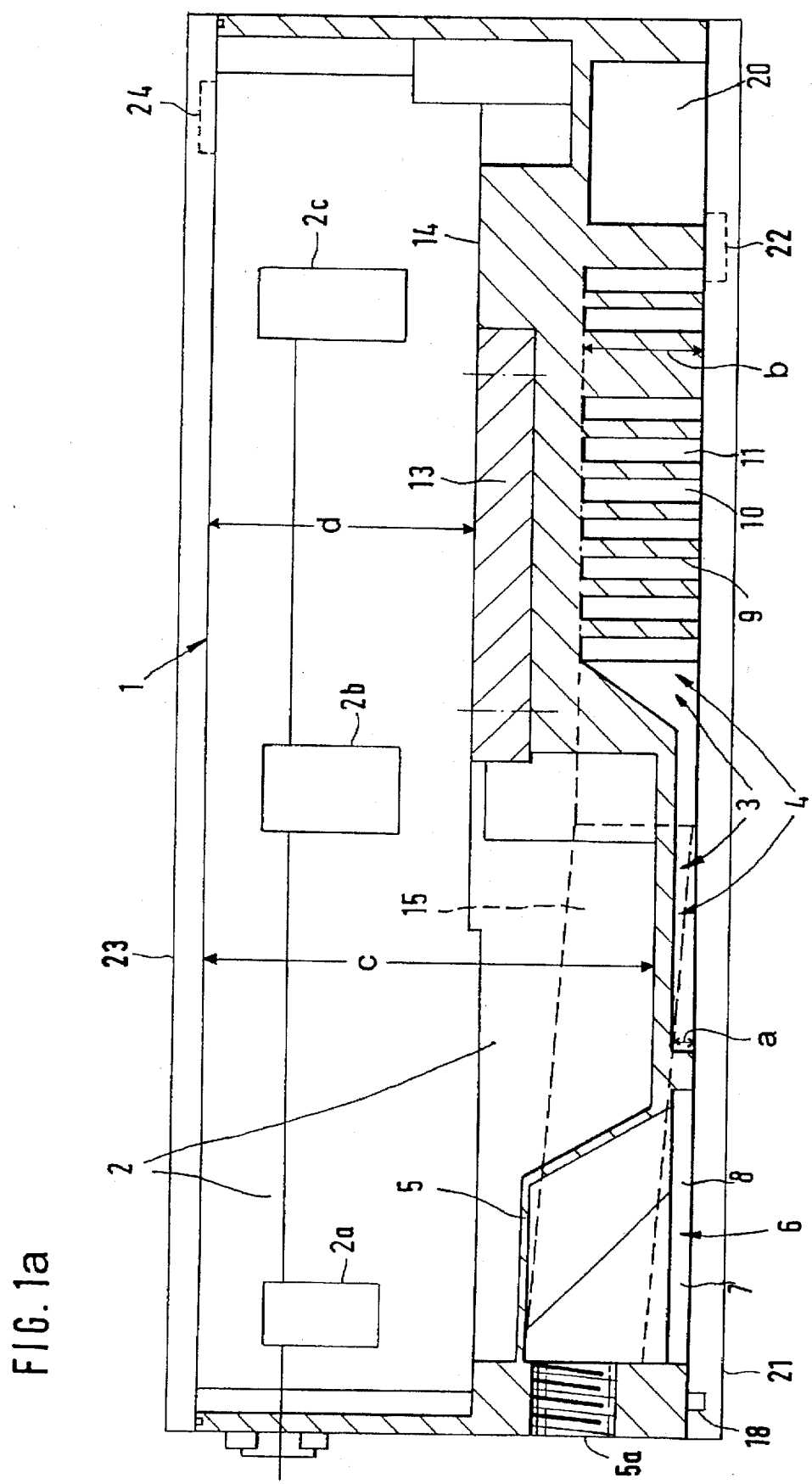
FIG. 1a is a further description of the embodiment illustrated in FIG. 1.

FIG. 1a is a further illustration of the embodiment shown in FIG. 1. Shown in the receptacle chamber 2 are predetermined components 2a, 2b, 2c. The threaded inlet 5a is intended for connection to hose section 130a or hose section 130b, illustrated in FIG. 3a. A thin cover or bottom plate 21 is disposed near seal 18. Connection device 22 is shown, illustrated the attachment of the thin cover or bottom plate 21 to the housing 1.

In this embodiment the first segment 7 has a height as designated by the letter "a", and the second segment 8 has a height as designated by letter "b." The receptacle chamber 2 has a varying height dimension, with a height "c", extending from the thin cover or top plate 23 to the flow guide 4 adjacent the first segment 7, and a fourth height "d", extending from the top plate 23 to the separation plate 13.

Figure 2A:
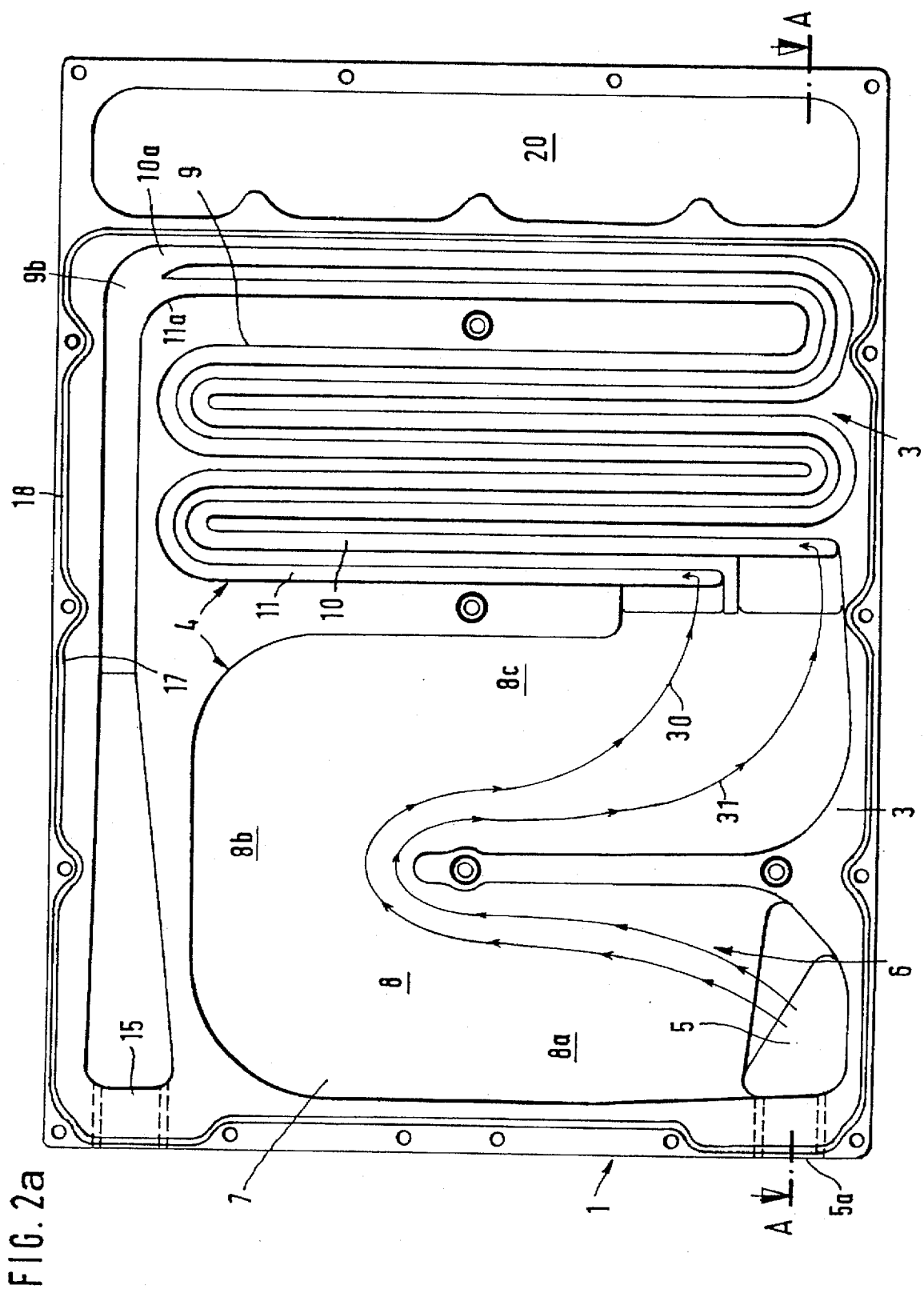
FIG. 2a is a further description of the embodiment illustrated in FIG. 2.

FIG. 2a is a further illustration of the embodiment shown in FIG. 2. FIG. 2a illustrates the flow of the coolant using flow patterns 30 and 31. The coolant first flows into the trough 8 through the inlet 5. After entering the trough 8, the fluid first flows through trough segment 8a, then further through the trough 8 into trough segment 8b, and then even further into trough segment 8c. The coolant then flows into channels 10, 11. The channels 10, 11 are arranged in a serpentine form. After passing through the channels 10, 11, the coolant enters channel segments 11a, 10a of channels 10, 11, at which point the channels 10, 11 combine into one channel segment 9b. The coolant then exits through outlet 15.

One feature of the invention resides broadly in the housing with a receptacle chamber designed for the installation of pre-determined components, and with a cooling chamber sealed with respect to the receptacle chamber and adjacent to it, which cooling chamber is connected to an inlet or feed for coolant and to an outlet or discharge for the coolant, characterized by the fact that the cooling chamber 3 is provided with an integrated flow guide 4 for the coolant, which in a segment 7 has an expanded portion 6 which provides for a distribution of the coolant over a large surface, and in an additional segment 9 runs so that, in relation to a predetermined total length of the flow guide 4, the heat exchange surface of the flow guide assumes a maximum opposite the contact surface 14 present in this segment 9 between the cooling chamber 3 and the receptacle chamber 2.

Another feature of the invention resides broadly in the housing characterized by the fact that the segment 7 which provides for a distribution of the coolant over a large surface is adjacent to the inlet 5 and the other segment 9 empties into the outlet 15.

Yet another feature of the invention resides broadly in the housing characterized by the fact that the flow guide 4 in the first segment 7 is formed by a broad trough 8 of low height.

Still another feature of the invention resides broadly in the housing characterized by the fact that the trough 8 has the smallest possible number of flow deflectors.

A further feature of the invention resides broadly in the housing characterized by the fact that the flow guide 4 in the second segment 9 is formed by at least one channel 10, 11 which leads by means of a number of flow deflectors to the discharge 15.

Another feature of the invention resides broadly in the housing characterized by the fact that the flow guide 4 in the second segment 9 can be guided to a higher level as the distance from the first segment 7 increases.

Yet another feature of the invention resides broadly in the housing characterized by the fact that the flow guide 4 reaches its highest level when it reaches the outlet 15.

Still another feature of the invention resides broadly in the housing characterized by the fact that at least the second segment is divided from the receptacle chamber 2 by a separation plate 13.

The components disclosed in the various publications, disclosed or incorporated by reference herein, may be used in the embodiments of the present invention, as well as, equivalents thereof.

The appended drawings in their entirety, including all dimensions, proportions and/or shapes in at least one embodiment of the invention, are accurate and to scale and are hereby included by reference into this specification.

All, or substantially all, of the components and methods of the various embodiments may be used with at least one embodiment or all of the embodiments, if more than one embodiment is described herein.

This invention relates to a housing, and more specifically to a housing with a receptacle chamber designed for the installation of pre-determined components, and with a cooling chamber sealed with respect to the receptacle chamber and adjacent to it, which cooling chamber is connected to an inlet or feed for coolant and to an outlet or discharge for the coolant.

A housing with a receptacle chamber designed for the installation of pre-determined components, and with a cooling chamber sealed with respect to the receptacle chamber and adjacent to it, which cooling chamber is connected with an inlet for coolant and with an outlet for the coolant, has been improved so that no coolant can get into the receptacle chamber, and the receptacle chamber has zones in which different degrees of cooling can take place. For this purpose the cooling chamber is provided with an integrated flow guide for the coolant which, in a first segment adjacent to the inlet, has an expanded portion which provides for a distribution of the coolant over a large surface, and in a second segment runs so that, in relation to a predetermined total length of the flow guide, the heat exchange surface of the flow guide assumes a maximum opposite the contact surface in this segment between the cooling chamber and the receptacle chamber.

Examples of antilock brake systems which may be utilized with the present invention to have their components cooled may be found in the following U.S. patents: U.S. Pat. No. 4,917,443, entitled "Antilock Brake Controller With Fail-Safe Microprocessor; " U.S. Pat. No. 4,925,254, entitled "Anti-lock Brake System for Vehicles;" U.S. Pat. No. 4,890,891, entitled "Antilock System for a Road Vehicle;" U.S. Pat. No. 4,892,363, entitled "Anti-locking Brake System;" U.S. Pat. No. 4,653,816, entitled "Anti-lock Brake Control System;" U.S. Pat. No. 4,664,453, entitled "Anti-lock Brake Control System;" U.S. Pat. No. 4,673,225, entitled "Anti-lock Brake Control System;" U.S. Pat. No. 4,685,746, entitled "Anti-Ski Brake Control System for Automotive Brake System with Extrapolation of Wheel Acceleration."

Examples of suspension systems with which the present invention may be utilized to cool their components may be found in the following U.S. patents: U.S. Pat. No. 4,949,262, entitled "Electronic Controlled Fluid Suspension System with an Advance Control and a Feedback Control of a Vehicle Attitude;" U.S. Pat. No. 4,937,748, entitled "Electronic Controlled Fluid Suspension System;" U.S. Pat. No. 4,919,440, entitled "Actively Controlled Suspension System for Automotive Vehicle with Fail-Safe System in Response to Failure of Electric Circuitry;" U.S. Pat. No. 4,897,776, entitled "Electronic Controlled Fluid Suspension System for Controlling Roll and Pitch of a Vehicle Body;" and U.S. Pat. No. 5,169,112, entitled "Electronic Suspension Vehicle Seat."

Examples of windshield devices in which the present invention may be utilized to cool their components may be found in the following U.S. patents: U.S. Pat. No. 5,072,098, entitled "Electrically Heated Windshield Controller;" and U.S. Pat. No. 5,095,222 entitled "System for Controlling Raised-Voltage Defrosting of an Electric Windshield in a Motor Vehicle."

Examples of air conditioning devices with which the present invention may be utilized to have their components cooled may be found in the following U.S. patents: U.S. Pat. No. RE33687, entitled "Auxiliary Air Conditioning, Heating and Engine Warming System for Trucks," and U.S. Pat. No. 4,922,171, entitled "Motor Actuator with Air-Mix Door Opening-Limiter and Built-in Switching Unit."

Examples of transmissions with which the present invention may be utilized to have their components cooled may be found in the following U.S. patents: U.S. Pat. No. 5,044,227, entitled "Vehicle Transmissions Equipped with Electric Retarders;" U.S. Pat. No. 5,035,254, entitled "Power Transmission;" and U.S. Pat. No. 4,997,002, entitled "Power Transmission."

Examples of power steering systems with which this present invention may be utilized to have their components cooled may be found in the following U.S. patents: U.S. Pat. No. 5,027,915, entitled "Electric Power Steering System;" U.S. Pat. No. 4,895,216, entitled "Electrically Driven Power Steering Apparatus;" U.S. Pat. No. 4,896,735, entitled "Electric Motor Assisted Power Steering Device;" U.S. Pat. No. 4,898,258, entitled "Electric Power Steering Apparatus;" U.S. Pat. No. 4,909,343, entitled "Electric Power Steering System;" U.S. Pat. No. 4,913,249, entitled "Auxiliary Power Steering Mechanism, Especially for Motor Vehicles;" U.S. Pat. No. 4,921,061, entitled "Electric Power Steering Apparatus;" U.S. Pat. No. 4,926,960, entitled "Electric Power Steering Apparatus for a Vehicle;" U.S. Pat. No. 4,934,472, entitled "Power Assisted Steering System for a Motor Vehicle and Control Means Therefor;" and U.S. Pat. No. 4,939,435, entitled "Torque Detecting Apparatus."

Examples of fans with which the present invention may be utilized to have their components cooled may be found in U.S. Pat. No. 5,133,302, entitled "Electric Motor Fan Control System for a Vehicle," and U.S. Pat. No. 4,977,862, entitled "Engine Room-Cooling Control System."

All of the patents, patent application and publications recited herein, and in the Declaration attached hereto, are hereby incorporated by reference as if set forth in their entirety herein.

The corresponding foreign patent publication applications, namely, Federal Republic of Germany Patent Application No. P 44 16 616.8, filed on May 11, 1994, having inventors Holger Demmler and Adolf Karl, and DE-OS P 44 16 616.8 and DE-PS P 44 16 616.8, as well as their published equivalents, and other equivalents or corresponding applications, if any, in corresponding cases in the Federal Republic of Germany and elsewhere, and the references cited in any of the documents cited herein, are hereby incorporated by reference as if set forth in their entirety herein.

The details in the patents, patent applications and publications may be considered to be incorporable, at applicant's option, into the claims during prosecution as further limitations in the claims to patentably distinguish any amended claims from any applied prior art.

The invention as described hereinabove in the context of the preferred embodiments is not to be taken as limited to all of the provided details thereof, since modifications and variations thereof may be made without departing from the spirit and scope of the invention.

What is claimed is:

1. A cooling arrangement in a motor vehicle, said cooling arrangement comprising:

a housing;

said housing comprising:

a coolant chamber for receiving a coolant and a device chamber for receiving devices to be cooled;

said coolant chamber having input means and output means;

said input means comprising means for receiving a flowing fluid coolant;

said output means comprising means for discharging a flowing fluid coolant;

means for separating said coolant chamber and said device chamber;

said separating means comprising a wall structure;

said wall structure comprising an integral continuously solid, substantially homogeneous structure wall without seals disposed between said coolant chamber and said device chamber;

means for guiding coolant between said input means and said output means;

said coolant chamber comprising a first portion and a second portion;

said first chamber portion having a first width and a first length;

said first width and said first length defining a substantially open area;

said first chamber portion being connected to receive coolant substantially directly from said input means;

said guide means comprising a first part disposed in said first chamber portion and a second part disposed in said second chamber portion;

said second part comprising a heat exchange surface for exchanging heat between said device chamber and said second chamber portion;

said heat exchange surface being configured to maximize a heat exchange surface area of said second part of said guide means;

said first chamber portion being connected to said second chamber portion for communicating fluid therebetween;

said second chamber portion being connected for discharging coolant flow from said second chamber portion through said outlet means;

said first chamber portion having a first height;

said second chamber portion having a second height, a second length, and a second width;

the heights being in a direction substantially perpendicular to said wall structure;

said second height being substantially greater than said second width;

said first height being substantially shorter than said second height;

said first chamber portion comprising a broad trough;

said broad trough having said first height;

said device chamber having a first portion adjacent said first chamber portion, and a second portion adjacent said second chamber portion;

said first portion of said device chamber having a third height;

said second portion of said device chamber having a fourth height;

said first height being substantially shorter than said third height; and said fourth height being shorter than said third height.

2. The cooling arrangement according to claim 1, wherein:

said means for guiding coolant comprises flow deflectors for changing the direction of the flow of said coolant fluid; and said first part of said guide means comprises at least one of said flow detectors.

3. The cooling arrangement according to claim 2, wherein:

said second part of said guide means comprises a plurality of said flow deflectors to form at least one channel having a serpentine configuration;

said at least one channel has a first end and a second end;

said first end is connected to said first chamber portion for being in fluid connection with said first chamber portion;

said second end is adjacent to said output means; and said second length is substantially greater than said second height.

4. The cooling arrangement according to claim 3, wherein at least said second portion is divided from said receptacle chamber by a separation plate.

5. The cooling arrangement according to claim 4, wherein:

said at least one channel comprises a middle segment;

said middle segment being disposed between said first end and said second end;

said first end is disposed at a first level within said housing;

said second end is disposed at a second level within said housing;

said first level is lower than said second level;

said middle segment is configured to gradually ascend from said first end to said second end; and said at least one channel reaches its highest level within said housing at said outlet means.

6. The cooling arrangement according to claim 5, wherein:

said housing further comprises sealing means for sealing said device chamber with respect to the environment of said housing;

said sealing means comprises a seal disposed adjacent the circumference of said housing;

said housing further comprises an equalization chamber;

said equalization chamber comprises means for absorbing and dissipating pressure fluctuations within said device chamber; and said first part of said guide means comprises one flow deflector.

7. The cooling arrangement according to claim 4, wherein:

said housing further comprises a sealing means for sealing said device chamber with respect to the environment of said housing;

said sealing means comprises a seal disposed adjacent the circumference of said coolant chamber;

said housing further comprises an equalization chamber;

said equalization chamber comprises means for absorbing and dissipating pressure fluctuations within said device chamber; and said first part of said guide means comprises one flow deflector.

8. A housing system in a motor vehicle, said housing system comprising;

a receptacle chamber;

said receptacle chamber being configured for receiving pre-determined components;

a coolant chamber being disposed adjacent to said receptacle chamber;

means for separating said coolant chamber and said receptacle chamber;

said separating means comprising a wall structure;

said wall structure comprising an integral continuously solid, substantially homogeneous structure wall disposed between said coolant chamber and said receptacle chamber;

said coolant chamber having input means for receiving a flowing fluid coolant;

said coolant chamber having output means for discharging a flowing fluid coolant;

said coolant chamber comprising a flow guide for said flowing fluid coolant;

said flow guide being integrated in said continuous solid, substantially homogeneous structure wall such that said wall comprises at least a portion of said flow guide;

said coolant chamber comprising a first portion and a second portion;

said first portion comprising a first width and a first length;

said width and said length defining a substantially open area;

said second portion comprising at least one channel;

said at least one channel having a second width and a second length;

said wall structure comprising a heat exchange surface disposed between said coolant chamber and said receptacle chamber;

said heat exchange surface having a first portion and a second portion;

said first portion of said heat exchange surface is adjacent said first portion of said coolant chamber;

said second portion of said heat exchange surface is adjacent said second portion of said coolant chamber;

said second portion of said heat exchange surface is configured so as to maximize a heat exchange surface area of said second portion of said heat exchange surface;

a substantial portion of said second portion of said heat exchange surface being comprised by said flow guide;

said first chamber portion having a first height;

said at least one channel having a second height;

the heights being in a direction substantially perpendicular to said wall structure;

said second height being substantially greater than said second width;

said first height being substantially shorter than said second height;

said first chamber portion comprising a broad trough;

said broad trough having said first height;

said receptacle chamber having a first portion adjacent said first chamber portion, and a second portion adjacent said second chamber portion;

said first portion of said receptacle chamber having a third height;

said second portion of said receptacle chamber having a fourth height;

said first height being substantially shorter than said third height;

said fourth height being shorter than said third height; and said second width being substantially smaller than said first width.

9. A housing system in a motor vehicle, said housing system comprising:

a receptacle chamber;

said receptacle chamber being configured for receiving pre-determined components;

a coolant chamber being disposed adjacent to said receptacle chamber;

means for separating said coolant chamber and said receptacle chamber;

said separating means comprising a wall structure;

said wall structure comprising an integral continuously solid, substantially homogeneous structure wall without seals disposed between said coolant chamber and said receptacle chamber;

said coolant chamber having input means for receiving a flowing fluid coolant;

said coolant chamber having output means for discharging a flowing fluid coolant;

said coolant chamber comprising a flow guide for said flowing fluid coolant;

said flow guide being integrated in said continuous solid, substantially homogeneous structure wall such that said wall comprises at least a portion of said flow guide;

said coolant chamber comprising a first portion and a second portion;

said first portion comprising a first width and a first length;

said width and said length defining a substantially open area;

said second portion comprising at least one channel;

said at least one channel having a second width and a second length;

said wall structure comprising a heat exchange surface disposed between said coolant chamber and said receptacle chamber;

said heat exchange surface being disposed to provide heat exchange between said coolant chamber and said receptacle chamber;

said heat exchange surface having a first portion and a second portion;

said first portion of said heat exchange surface being adjacent said first portion of said coolant chamber;

said second portion of said heat exchange surface being adjacent said second portion of said coolant chamber;

said second portion of said heat exchange surface being configured so as to maximize a heat exchange surface area of said second portion of said heat exchange surface;

a substantial portion of said second portion of said heat exchange surface being comprised by said flow guide;

said first portion of said coolant chamber being adjacent to said input means and said second portion being adjacent to said output means;

said first chamber portion having a first height;

said at least one channel having a second height;

the heights being in a direction substantially perpendicular to said wall structure;

said second height being substantially greater than said second width;

said first height being substantially shorter than said second height;

said first chamber portion comprising a broad trough;

said broad trough having said first height;

said device chamber having a first portion adjacent said first chamber portion, and a second portion adjacent said second chamber portion;

said first portion of said device chamber having a third height;

said second portion of said device chamber having a fourth height;

said first height being substantially shorter than said third height;

said fourth height being shorter than said third height; and said second width being substantially smaller than said first width.

10. The housing according to claim 9, wherein:

said flow guide comprises flow deflectors for changing the direction of the flow of said coolant fluid;

said broad trough comprises at least one flow deflector;

said second chamber portion comprises a plurality of said flow deflectors to form said at least one channel having a serpentine configuration;

said at least one channel has a first end and a second end;

said first end is connected to said first chamber portion for being in fluid connection with said first chamber portion;

said second end is adjacent to said output means.

11. The housing according to claim 10, wherein at least said second portion is divided from said receptacle chamber by a separation plate.

12. The housing according to claim 11, wherein:

said second portion comprises a middle segment;

said middle segment being disposed between said first end and said second end;

said first end being disposed at a first level within said housing;

said second end being disposed at a second level within said housing;

said first level being lower than said second level;

said middle segment being configured to gradually ascend from said first end to said second end; and said flow guide reaches its highest level within said housing at said outlet means.

13. The housing according to claim 12, wherein said housing further comprises a sealing means for sealing said receptacle chamber with respect to the environment of said housing;

said sealing means comprises a seal disposed adjacent the circumference of said coolant chamber;

said housing further comprises an equalization chamber;

said equalization chamber comprises means for absorbing and dissipating pressure fluctuations within said receptacle chamber; and said broad trough comprises one flow deflector.

14. The housing according to claim 11, wherein said housing further comprises a sealing means for sealing said receptacle chamber with respect to the environment of said housing;

said sealing means comprises a seal disposed adjacent the circumference of said coolant chamber;

said housing further comprises an equalization chamber;

said equalization chamber comprises means for absorbing and dissipating pressure fluctuations within said receptacle chamber; and said broad trough comprises one flow deflector.

15. A cooling arrangement in a motor vehicle, said cooling arrangement comprising:

a housing;

said housing comprising:
- a chamber for receiving a coolant and a chamber for receiving devices to be cooled;
- said coolant chamber having input means and output means;
- said input means comprising means for receiving a flowing fluid coolant;
- said output means comprising means for discharging a flowing fluid coolant;
- means for separating said coolant chamber and said device chamber;
- said separating means comprising a wall structure;
- said wall structure comprising an integral continuously solid, substantially homogeneous structure wall disposed between said coolant chamber and said device chamber;
- means for guiding coolant between said input means and said output means;
- said coolant chamber comprising a first portion and a second portion;
- said first chamber portion having a first height;
- said second chamber portion having a second height, a second length, and a second width;
- the heights being in a direction substantially perpendicular to said wall structure;
- said second height being substantially greater than said second width;
- said first height being substantially shorter than said second height;
- said first chamber portion comprising a broad trough;
- said broad trough having said first height;
- said device chamber having a first portion adjacent said first chamber portion, and a second portion adjacent said second chamber portion;
- said first portion of said device chamber having a third height;
- said second portion of said device chamber having a fourth height;
- said first height being substantially shorter than said third height; and
- said fourth height being shorter than said third height.

* * * * *

UNITED STATES PATENT AND TRADEMARK OFFICE
CERTIFICATE OF CORRECTION

PATENT NO. : 5,685,361
DATED : November 11, 1997
INVENTOR(S) : Holger DEMMLER and Adolf KARL It is certified that error appears in the above-identified patent and that said Letters Patent is hereby corrected as shown below:

In column 1, line 64, after 'it', delete "an" and insert --and--.

Signed and Sealed this

Fourteenth Day of April, 1998

*Attest:*

BRUCE LEHMAN

*Attesting Officer*    *Commissioner of Patents and Trademarks*